(12) United States Patent
Lockett et al.

(10) Patent No.: US 8,610,310 B2
(45) Date of Patent: Dec. 17, 2013

(54) WIRELESS ETHERNET SYSTEM

(75) Inventors: David A. Lockett, Los Gatos, CA (US); Kurtis G. Heaton, Pleasanton, CA (US)

(73) Assignee: TiVo Inc., Alviso, CA (US)

( * ) Notice: Subject to any disclaimer, the term of this patent is extended or adjusted under 35 U.S.C. 154(b) by 787 days.

(21) Appl. No.: 12/393,025

(22) Filed: Feb. 25, 2009

(65) Prior Publication Data

US 2009/0214051 A1 Aug. 27, 2009

Related U.S. Application Data

(60) Provisional application No. 61/031,312, filed on Feb. 25, 2008.

(51) Int. Cl.
*H04B 5/02* (2006.01)
*H04B 1/03* (2006.01)
*H04B 1/38* (2006.01)

(52) U.S. Cl.
USPC .......................................................... 307/104

(58) Field of Classification Search
USPC .......................................................... 307/104
See application file for complete search history.

(56) References Cited

U.S. PATENT DOCUMENTS

| | | | | |
|---|---|---|---|---|
| 5,070,500 | A * | 12/1991 | Horinouchi et al. | 365/189.02 |
| 6,073,855 | A | 6/2000 | MacKenthun | |
| 6,505,087 | B1 | 1/2003 | Lucas et al. | |
| 6,870,475 | B2 * | 3/2005 | Fitch et al. | 340/539.12 |
| 7,304,405 | B2 * | 12/2007 | Kelly et al. | 307/147 |
| 7,352,567 | B2 * | 4/2008 | Hotelling et al. | 361/679.55 |
| 7,715,187 | B2 * | 5/2010 | Hotelling et al. | 361/679.41 |
| 2002/0063621 | A1 | 5/2002 | Tseng et al. | |
| 2004/0198101 | A1 | 10/2004 | Rapp | |

(Continued)

FOREIGN PATENT DOCUMENTS

| | | |
|---|---|---|
| JP | 07-020972 | 1/1995 |
| JP | 10-143288 | 5/1998 |

(Continued)

OTHER PUBLICATIONS

State Intellectual Property Office of the People's Republic of China, "First Office Action" in Chinese Patent Application No. 2008980106114.1 English Translation, Applicant: TiVo Inc., Dated Sep. 14, 2011, 9 pages.

(Continued)

*Primary Examiner* — Adi Amrany
(74) *Attorney, Agent, or Firm* — Hickman Palermo Truong Becker Bingham Wong LLP; Kirk D. Wong

(57) ABSTRACT

A method and apparatus describes a stackable communications system. A system is modularized and stacked in various configurations. The interconnections between the modules may be by close proximity inductively coupled wireless Ethernet connections or a physical connection mechanism. Each module detects the power requirement of modules installed next to it. When a new module is installed, the module below determines the power requirements of the new module and whether adequate power is available. If adequate power is available, the new module is powered. An audio system that comprises an audio server and individual speaker clients may also be connected. Individual speaker clients may be the same physical configuration. When the audio server detects each speaker client, the audio server configures each speaker to a particular purpose. This allows the same type of speakers to be used for different features. Other audio devices may also be connected to the audio server.

16 Claims, 13 Drawing Sheets

(56) References Cited

U.S. PATENT DOCUMENTS

| | | |
|---|---|---|
| 2004/0218688 A1* | 11/2004 | Santhoff et al. ............... 375/295 |
| 2005/0152557 A1 | 7/2005 | Sasaki et al. |
| 2006/0098666 A1* | 5/2006 | Francis Conde Powell .. 370/401 |
| 2006/0159158 A1* | 7/2006 | Moore et al. .................. 375/130 |
| 2006/0285289 A1 | 12/2006 | Jones et al. |
| 2007/0070566 A1 | 3/2007 | Campini et al. |
| 2007/0140319 A1* | 6/2007 | Park et al. ..................... 375/130 |
| 2010/0044333 A1* | 2/2010 | Marvel et al. .................. 213/1.3 |

FOREIGN PATENT DOCUMENTS

| | | |
|---|---|---|
| JP | 2001-092572 | 4/2001 |
| WO | WO9324878 A1 | 12/1993 |
| WO | WO 96/14614 | 5/1996 |
| WO | WO 2006/067528 A2 | 6/2006 |
| WO | WO2006/067528 A2 | 6/2006 |
| WO | WO 2007/063500 A2 | 6/2007 |
| WO | WO 2007/141677 A1 | 12/2007 |

OTHER PUBLICATIONS

Current Claims in application No. 2008980106114.1, dated Sep. 2011, 7 pages.

"First Office Action" in Australian Patent Application No. 2009219346 English Translation, Applicant: TiVo Inc., Dated Mar. 18, 2011, 3 pages.

Current Claims Australian Patent Application No. 2009219346, dated Apr. 4 2011, 7 pages.

International Search Report and Written Opinion, PCT Application No. PCT/US2009/035199; dated Jun. 29, 2009, 14 pages.

Claims, PCT Application No. PCT/US2009/035199, 7 pages.

Japan Patent Office, "Notification of Reasons for Rejection" in application No. 2010-547870 dated May 3, 2013, 7 pages.

Current Claims in application No. 2010-547870 dated May 2013, 7 pages.

European Patent Office, "Search Report" in application No. 12162757.4-1905, dated Jul. 8, 2013, 5 pages.

Current Claims in application No. 12162757.4-1905, dated Jun. 2012 (most current claims to date), 4 pages.

European Patent Office, "Search Report", in application No. 09715270.6-1905, dated Jul. 23, 2013, 13 pages.

Current Claims in application No. 09715270.6-1905, dated Nov. 2010, 5 pages.

* cited by examiner

Vertical stack
of modules

Vertical stack
of modules

Horizontal stack
of modules

Horizontal stack
of modules

Horizontal stack
of modules

Horizontal and vertical stack
of modules

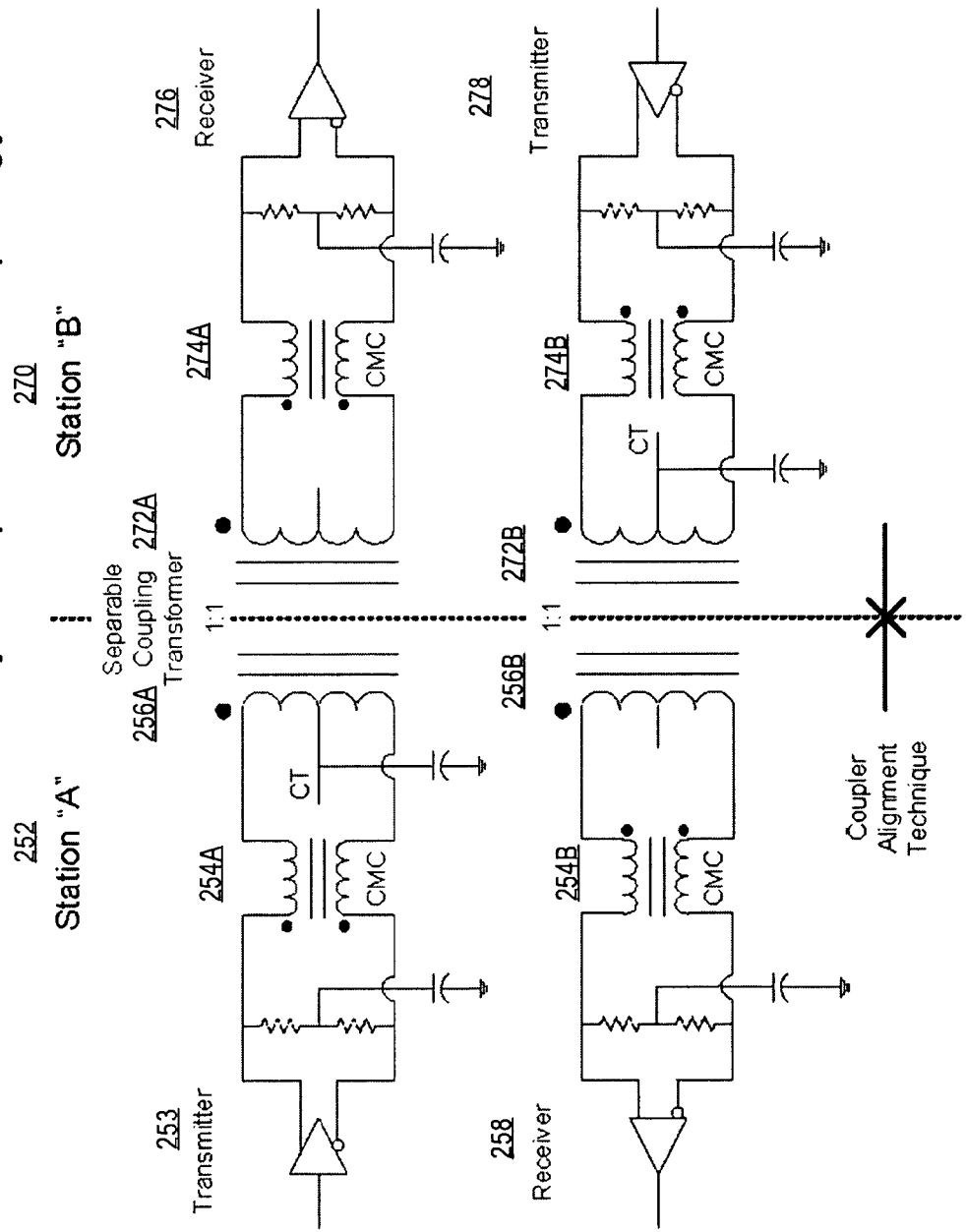

Typical 1000BASE-T Link Topology

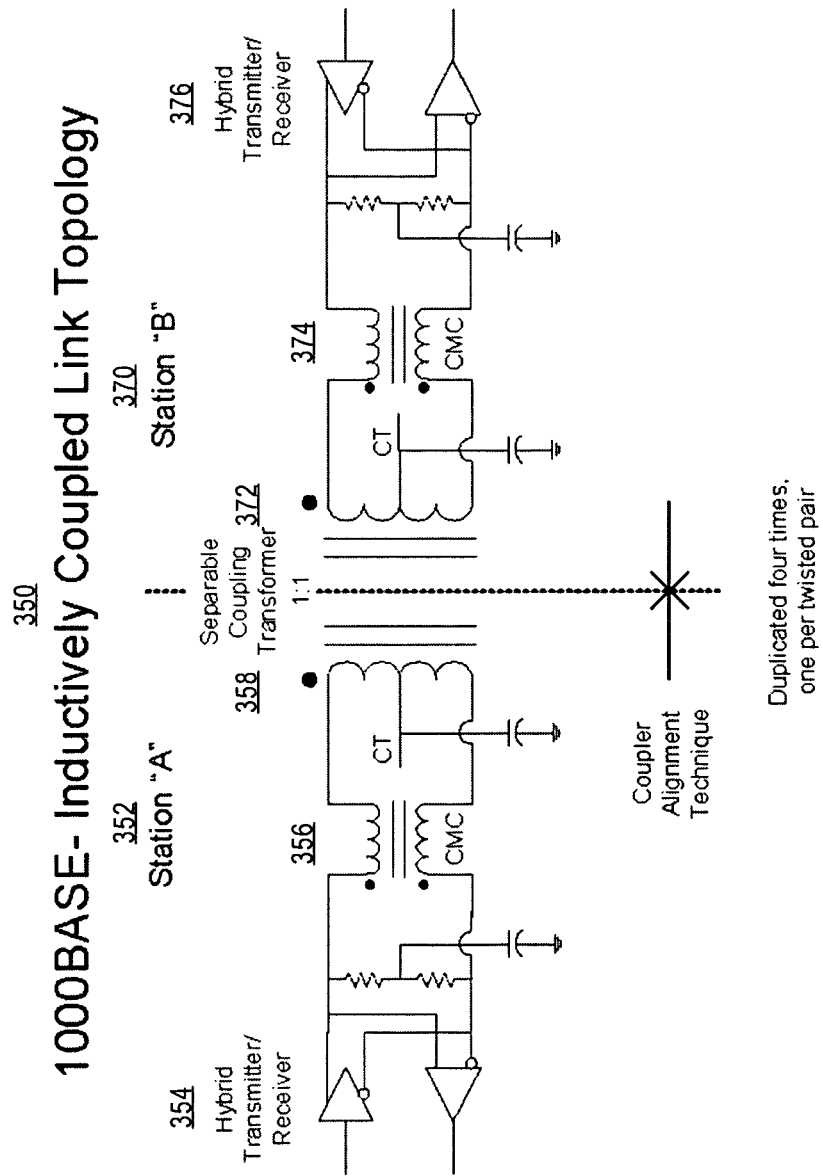

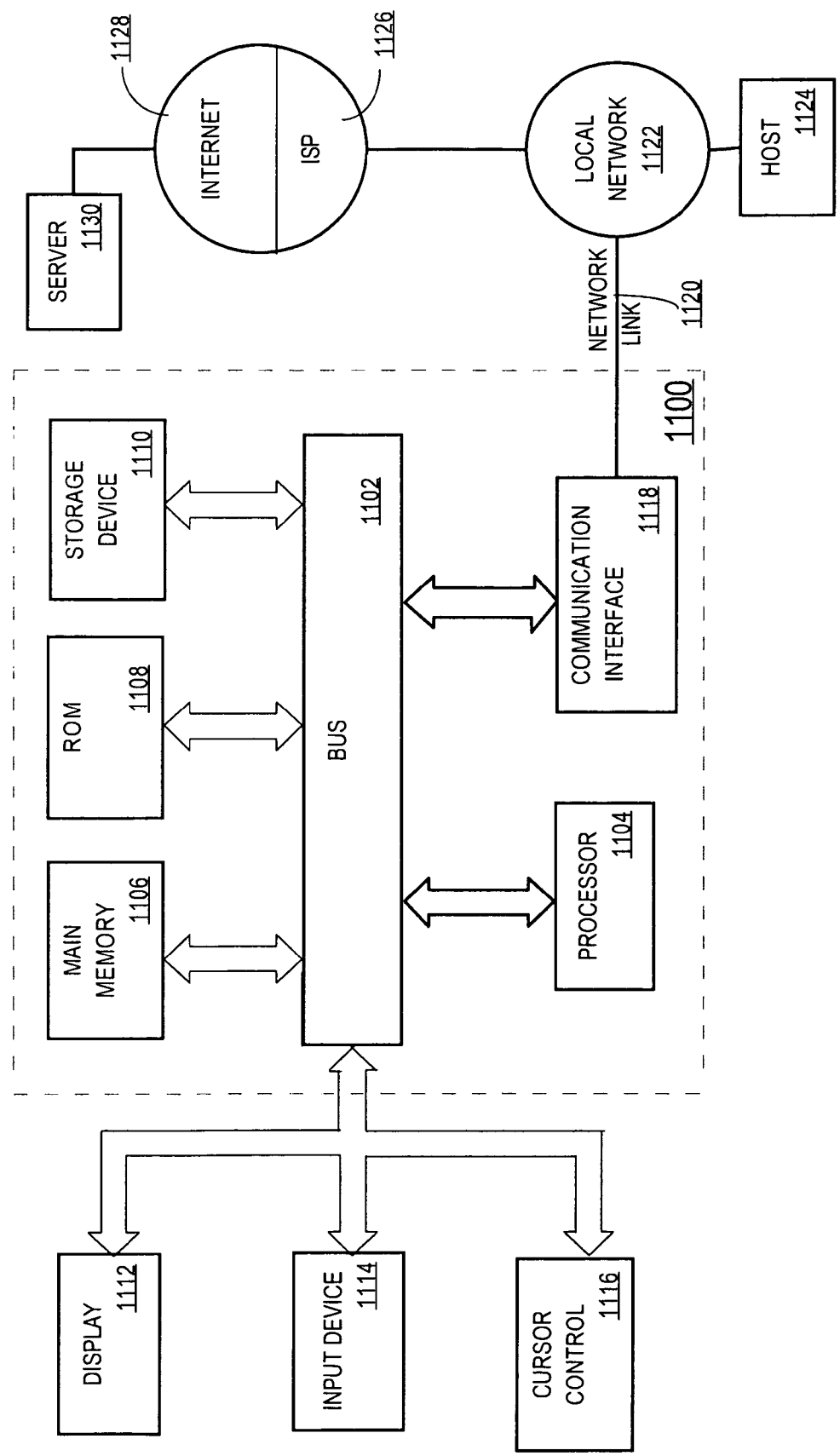

WIRELESS ETHERNET SYSTEM

CROSS-REFERENCE TO RELATED APPLICATIONS; PRIORITY CLAIM

This application claims benefit of U.S. Provisional Application 61/031,312, filed Feb. 25, 2008, the entire contents of which is hereby incorporated by reference as if fully set forth herein, under 35 U.S.C. §119(e).

FIELD OF THE INVENTION

The present invention generally relates to modular communications systems.

BACKGROUND

The approaches described in this section could be pursued, but are not necessarily approaches that have been previously conceived or pursued. Therefore, unless otherwise indicated herein, the approaches described in this section are not prior art to this application and are not admitted to be prior art by inclusion in this section.

As digital technology has become an important part of many persons' lives, the need to deliver this technology in more innovative and convenient ways has become more and more necessary. For example, televisions and methods to play content on televisions have encompassed many innovative changes throughout the years. From cathode ray tubes to digital flat panel video displays, the video cassette recorder to digital video recorders, the changes in technologies have brought about many changes to make viewing and playing content both more convenient and pleasing to the viewer. For example, wired connections made to a television set might be numerous and can easily lead to confusion for the consumer. A typical television setup might now have two High-Definition Multimedia Interface ("HDMI") interface connectors in order to connect a DVD player and a satellite receiver, several component cable connectors in order to connect high-definition devices such as a DVR recorder, RCA cable connectors to connect a video cassette recorder, and RF connectors in order to connect an antenna or cable signals. The number of different types of connections and wires might lead to confusion and incorrect cabling by the user. At best, the numerous wire connections are difficult to keep in order and the resulting mess of cables around the television set becomes an eyesore. Thus, more convenient and user-friendly solutions have become very important as television technology, and the resulting new types of wires and connections, becomes more advanced.

These changes and encompassing needs are not in any way limited to only to televisions but may be seen in many different technologies and venues such as, but not limited to, with telephone systems, entertainment systems, mobile communications, and computer systems. As technology changes in general, there is a need to present the technology in ways more convenient, user-friendly, and elegant to the user.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2A and 2B is a diagram that illustrates an example of connections made in a typical topology of 10/100BASE-TX and the same connection being made with close proximity inductively coupled wireless connections, according to an embodiment of the invention;

FIGS. 3A and 3B is a diagram that illustrates an example of connections made in typical topology of 1000BASE-T and the same connection being made with close proximity inductively coupled wireless connections, according to an embodiment of the invention;

FIG. 11 is a block diagram of a system on which embodiments of the invention may be implemented.

DETAILED DESCRIPTION

Figure 1A:
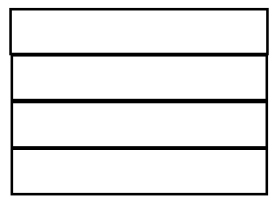
FIGS. 1A-1F are diagrams that illustrate examples of different module stacking methods, according to an embodiment of the invention.

An apparatus and methods in which to implement stackable and modular communications systems are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Embodiments are described herein according to the following outline:
   1.0 General Overview
   2.0 Modular and Stackable Communications Systems
      2.1 Interconnection between the Modules
         2.1.1 Close Proximity Inductively Coupled Wireless Ethernet Connections
         2.1.2 Close Proximity Capacitive Coupled Wireless Ethernet Connections
         2.1.3 Optical Connections
         2.1.4 Physical Connections
         2.1.5 Close Proximity Connections Placement within a Module and Network Topology within the set of Modules 2.2 Interconnection and Control of Power between Modules
2.3 Other Interconnection Configurations
2.4 Reconfigurable Audio System
3.0 Extensions and Alternatives
4.0 Implementation Mechanisms 1.0 General Overview The needs identified in the foregoing Background, and other needs and objects that will become apparent for the following description, are achieved in the present invention, which comprises different methods and apparatuses in which to implement modular and stackable communications systems.

As technology systems have become more and more sophisticated, the ability to customize a system for an individual presents many possibilities. In an embodiment, customizing a system for an individual is accomplished by modularizing particular features of the system. For example, in a television entertainment system, rather than providing a single box that contains a digital video recorder, a cable television decoder, a video cassette recorder, a sound processor, storage expansion, and some other feature for a television, a manufacturer might modularize each of the features so that a user may purchase only features that he or she wishes. In one example, a user might not have any need for a cable television decoder as the user does not subscribe to the cable television service or is unable to obtain the service at his or her particular residence. In another example, a video cassette recorder is not required as the user does not own any video cassette tapes. In an embodiment, a user purchases modules having particular features that he or she wishes to use and combines the modules to create a personalized system. Modularizing negates the need to purchase a more expensive device that includes many features that the user may never use. In addition, the multi-featured device is often not upgradeable and necessitates purchasing an entirely new device should the user wish a feature or technology that is developed a short time after purchase.

In addition, many traditional components, such as, but not limited to, DVR, cable set top, DVD player, IP set top, etc. have redundant functions that are common to each of the components. For example, more than one component might include a power supply, MPEG decoder, video scaler, video post processor, deinterlacer, or audio decoder, etc. In an embodiment, rather than duplicating each of these redundant features in separate components, common functions are implemented once in an individual module. The individual module may be a base module that is common to each stackable communications system or may be a module that has a particular feature and requires another function in order to operate correctly.

For example, a user might add modules to the stack such as a DVR tuner input module, cable decoder tuner input section module, and/or DVD disk loader, etc. Under this circumstance, the modules send media content data, control signals, and configuration data through a high bandwidth network backbone that interconnects the modules. With this system, display control and playback of content may be controlled using a single remote control and user interface, simplifying the user experience. Redundancy is reduced and many video/audio cables may be eliminated to simplify user setup. Modularizing also allows a user to upgrade particular features of a system more efficiently and cheaply.

In another embodiment, the modular system may be applied to television, set-top boxes, or to one of the modules in a stackable communication system. For example, a reconfigurable input/output panel may be implemented on a television system. Small input/output modules might be stacked vertically on the back of a set top box module of a television to add additional input/output and/or networking capabilities.

Modularizing in order to create a system is not limited to television-related technologies but may be applied to any technology that is capable of being modularized into different and separable parts. Some of these technologies may include, but are not limited to, telephone technologies, mobile entertainment technologies, computer networks, computer technologies, etc.

2.0 Modular and Stackable Communications Systems

There are many ways in which to combine modularized features into a system. In an embodiment, each module comprises a separate chassis, for example, a rectangular box, with each module able to be stacked vertically on top of other modules. In this embodiment, each module has identical width and length dimensions so that each module may be stacked on any other module. The height of each module may vary depending upon the technical feature of the module. In another embodiment, all dimensions of each module may be identical to all other modules. In yet another embodiment, each module has a particular shape that when combined with other modules, creates a new design. For example, each succeeding module that is placed higher than a particular module may be smaller in dimension than modules below the particular module such that when placed together, a shape substantially similar to a pyramid is formed. In another embodiment, the shape and size of each module is different but is configured in such a way as to enable each module to be stacked on any other module with close proximity. In this sense, the module may take any type of shape or size, but each module must be able to be correctly stacked and oriented with any other module.

In an embodiment, the order of the stacked modules does not matter and any module may be stacked on any other module. In another embodiment, modules are stacked in a particular order. Stacking the modules in a particular order may be for a variety of reasons. For example, some modules might be heavier and larger than others due to the feature offered by the module. The largest module might be a DVR player with an extremely large hard drive in order to be able to store a large amount of content. Thus, in the stacking scheme, the DVR module would always be placed in the bottom of the stack. Other modules may always be smaller and lighter and are hence placed higher in the vertical stack. The actual size of the module and the placement of the module may vary from implementation to implementation. As another example, modules that require more power might be located closer to the base module in order to ensure that adequate power is received.

In an embodiment, each module is stacked horizontally next to other modules substantially similar to how books are stacked next to each other on a bookshelf. In an embodiment, the height of each module stacked horizontally is substantially of equal size and the depth and width of each module may vary depending upon the feature presented by the module. For example, a particular module may be constrained by the electronics within the particular module and thus might need to be thicker than most other modules. In another embodiment, each module stacked horizontally is not of equal size but is configured in shape such as to be able to place each module in approximately close proximity to other modules stacked horizontally. The external features of the modules may be designed to mimic actual books.

In another embodiment, modules are stacked horizontally and also placed horizontally next to each other such that the side wall of each module touches the side wall of neighboring modules. In yet another embodiment, combinations of stacking configurations are used. For example, a vertically stacked set of modules may be placed next to another vertically stacked set of modules such that the side walls of one set of modules is flush with the side walls of the other set of modules. This combination of vertical stacking and horizontal placement allows inter-communication between all of the modules present. Each module has the capability to detect the orientation of any modules directly connected to it. This may be accomplished by the module detecting a connection with another module via a bottom, side, top, or rear surface connection.

Figure 1B:
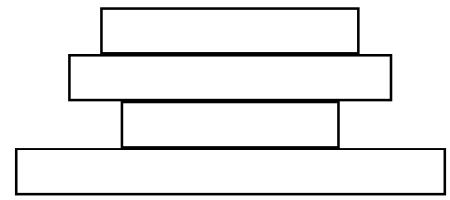
Figure 1C:
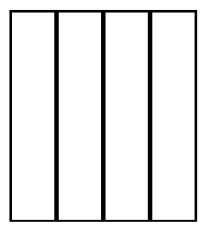
Figure 1D:
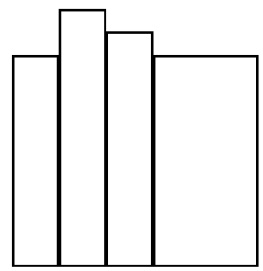
Figure 1E:
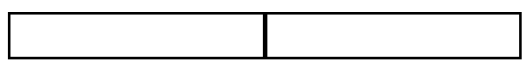
Figure 1F:
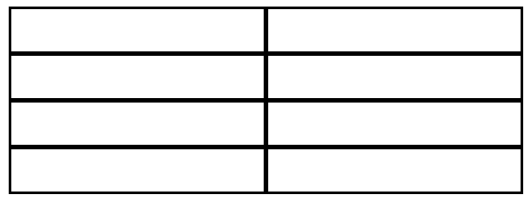

FIGS. 1A-1F display some possible embodiments of the stack of modules. FIG. 1A shows modules being stacked vertically on top of each other. This particular stack shows that each module is of identical height and width as other modules in the stack. FIG. 1B displays another vertical stack of modules, but this stack displays modules of varying height and width. Note that the depth may also vary for the stacks of modules and are not shown in the illustrations. FIG. 1C displays a stack of modules placed horizontally next to each other substantially similar to how books are stacked next to each other on a bookshelf. In the particular embodiment of FIG. 1C, each of the modules has identical heights and widths. FIG. 1D also shows modules placed horizontally next to each other but the heights and widths of each of the modules vary. In FIG. 1E, modules are placed in a horizontal configuration with other modules also placed horizontally next to the module. FIG. 1F displays two sets of modules stacked vertically on top of each other. One set of modules is placed horizontally next to the other set of modules such that each module may be in communication with all other modules.

In an embodiment, in order to ensure proper alignment of the modules adjacent to one another, magnets are located at a particular point on the module. When two adjacent modules are properly aligned, the magnets are attracted to each other and maintain correct alignment of the modules. If the adjacent modules are incorrectly aligned, the magnets repel each other and do not allow the user to position the modules in the incorrect position.

2.1 Interconnection Between the Modules

The modules are enabled to communicate data and power with other connected modules. In an embodiment, the presence of physical cabling is eliminated as much as possible between the modules. In all other respects, a high bandwidth data and power connection is maintained between the modules.

In an embodiment, the modules are connected via Ethernet connection. Ethernet networks are a very robust and reliable data interconnection method and are typically connected via twisted pair cables. Power transmission may also be implemented over an Ethernet connection further limiting the number of physical connections required between each module. A twisted pair cable may be, for example, a Cat 5e unshielded twisted pair cable, however any type of connection cable may be used that transmits the signal from one connection to the other connection.

In a typical Ethernet connection using twisted pair cable, the cable connects two devices together. Each end of the cable connects to a media interface connector. In each device, the media interface connector is associated with an isolation transformer. A common mode choke also may be present, depending upon the implementation. Both the isolation transformer and common mode choke, if present, help maintain the signal across the Ethernet network. Isolation transformers block transmission of DC signals from one circuit to the other, but allow AC signals to pass through. Common mode chokes reduce common mode noise from either being transmitted onto the cable connecting the devices and reduces noise picked up on the cable from making its way to the receiver and transmitter circuitry of the connected devices.

A transformer is a device that transfers electrical energy from one circuit to another through inductively coupled electrical conductors. Inductive coupling refers to the transfer of energy from one circuit component to another through a shared magnetic field. A change in current flow through the primary windings induces current flow in the secondary windings. The two devices may be physically contained in a single unit such as in the two sides of a transformer. The transformer is based on the principle that an electric current produces a magnetic field and that a changing magnetic field within a coil of wire induces a voltage across the ends of the coil, called electromagnetic induction. By changing the current in the primary coil, the strength of the magnetic field from the primary coil changes. Because the changing magnetic field extends into the secondary coil, a voltage is induced across the secondary coil, thereby transmitting a signal. The signal in the Ethernet connection travels from the media interface connector and then through the isolation transformer and the common mode choke, if present. The signal then travels to a communications chip that is able to receive or transmit signals over the network.

2.1.1 Close Proximity Inductively Coupled Wireless Ethernet

In an embodiment, rather than using twisted pair cable in order to effect the connection of the two separate devices, the media interface connector is bypassed and a connection is formed via a separable coupling transformer. The separable coupling transformer takes the place of the isolation transformers in the Ethernet connected device. In an embodiment, the separable coupling transformer is broken into two halves, where one half of the transformer is mounted in the side of each device in the communications link. When the two halves of the separable coupling transformer are placed in close proximity to each other, the transformer is able to transmit signals from one module or device to the other module or device using electromagnetic induction. The signal may be bi-directional between the modules. The ability of the isolation transformer to isolate DC signals is maintained with the transformer employed in the embodiment. However, the requirement for an isolation transformer to isolate the electronics from large voltages induced on the cable from lightning, electrical noise, etc. is not needed because the cable is no longer used.

In an embodiment, two close-proximity, inductively coupled connections are used to form a 10/100Base-TX connection. In another embodiment, four close-proximity, inductively coupled connections are used to form a 1000BASE-T connection. The number of connections may vary depending upon the networking standard used and the throughput sought in the connection. In an embodiment, if there is more than one close-proximity, inductively coupled connection between modules, then the close-proximity, inductively coupled connections are placed at a minimum distance apart such that cross-induction between the connections are decreased. Placing connections a minimum distance apart minimizes the probability that a signal made by a close-proximity, inductively coupled connection is impaired from cross-induction from adjoining inductively coupled connections.

Figure 2A:
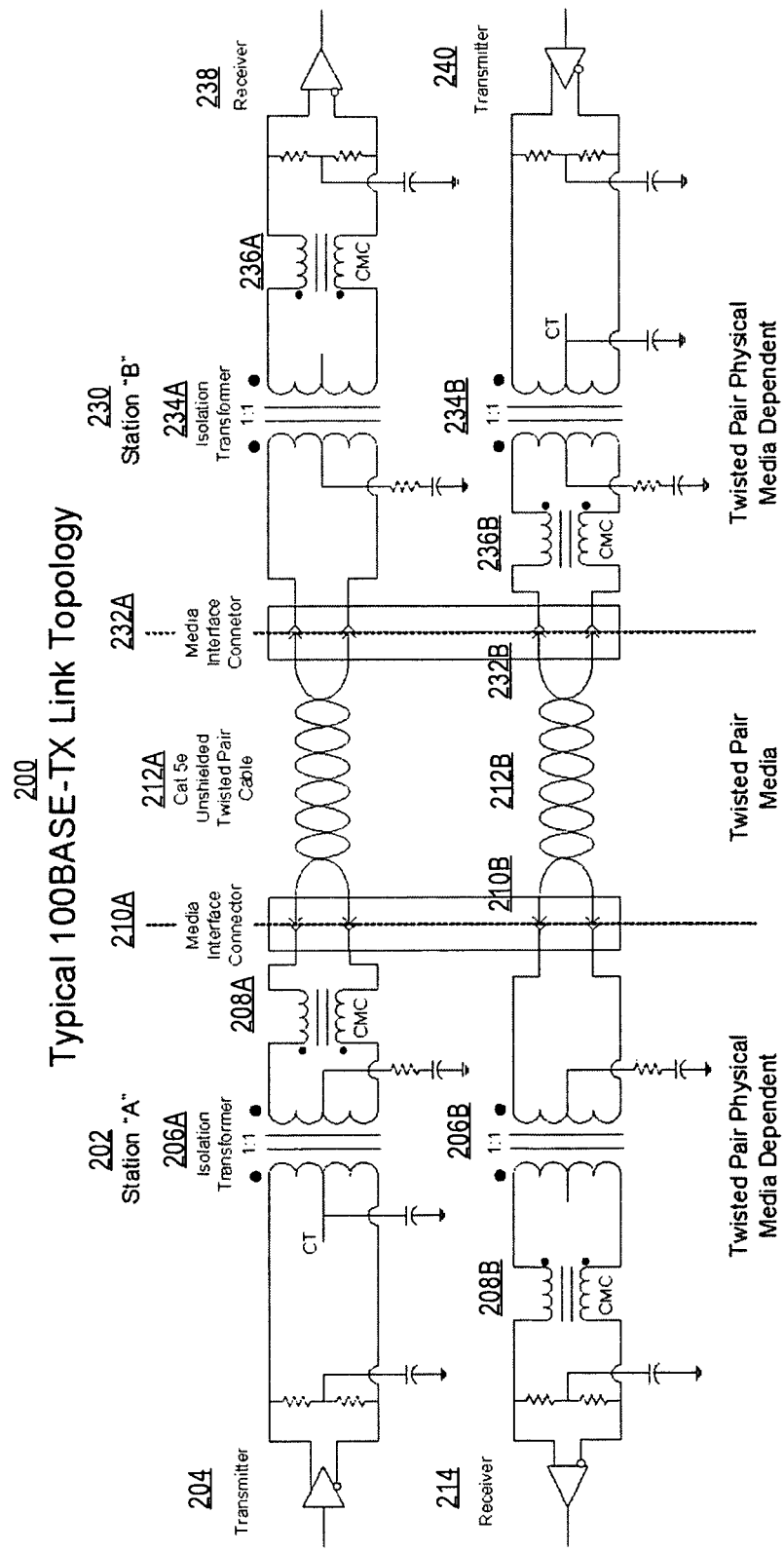

An illustration of an Ethernet connection based upon 10/100Base-TX Topology that carries network traffic at the nominal rate of either 10 Mbit/s or 100 Mbit/s and a wireless connection according to an embodiment of the invention and 10/100Base-TX Topology is shown in FIGS. 2A and 2B. FIG.

2A illustrates the typical topology for a 10/100Base-TX connection 200 using twisted pair cable from Station A 202 to Station B 230. Going from left to right which is the flow of network traffic with the connection located at the topmost of FIG. 2A, the transmitter 204 in Station A 202 is connected to an isolation transformer 206A and a common mode choke ("CMC") 208A. The CMC 208A is connected to the media interface connector 210A of Station A 202. A twisted pair cable 212A connects the media interface connector 210A of Station A 202 to the media interface connector 232A of Station B 230. In Station B 230, the media interface connector 232A is connected to the isolation transformer 234A, the CMC 236A, and finally the receiver 238. The other connection illustrated with Station A 202 and Station B 230 shows a connection with traffic flow in the opposite direction with a transmitter 240 at Station B 230 and a receiver 214 at Station A 202. From the transmitter at Station B, the network traffic then flows to the isolation transformer 234B, the CMC 236B, and then the media interface connector 232B of Station B 230. After crossing the twisted pair media 212B, traffic flows to Station A 202 first to the media interface connector 210B, the isolation transformer 206B, the CMC 208B, and finally the receiver 214.

FIG. 2B illustrates an Ethernet connection between Station A and Station B that displays a topology based on 10/100Base-TX that uses close proximity inductively coupled wireless connections 250. As shown in FIG. 2B, in place of the isolation transformer and twisted pair media that is seen in the traditional 10/100 Base-TX topology, is a separable coupling transformer that is aligned to connect Station A 252 and Station B 270. The media interface connector is no longer required in this connection but the CMC may still be present. Also, note that a connection is made for each direction of data. Data moves from transmitter 253 in Station A 252 to the CMC 254A and then the separable coupling transformer 256A of Station A 252. The signal passes to the separable coupling transformer 272A of station B 270, the CMC 274A, and finally the receiver 276. For the other connection shown in the lower section of the illustration, data transfers from the Station B 270 transmitter 278, then to the CMC 274B, and then the separable coupling transformer 272B on the Station B side. The data then passes to separable coupling transformer 256B of Station A 252, to the CMC 254B and then the receiver 258.

Figure 3A:
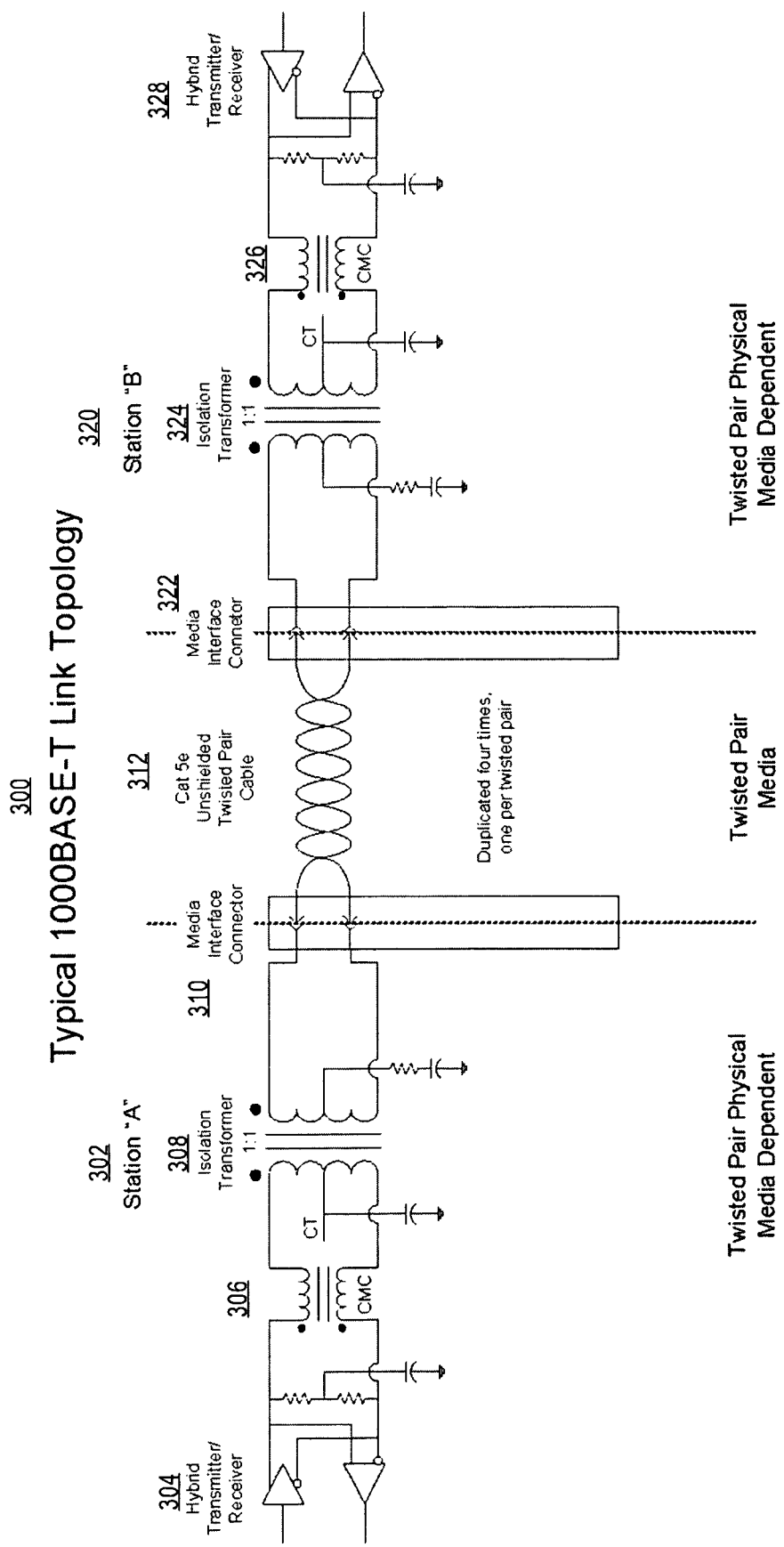

An illustration of an Ethernet connection based upon 1000BASE-T Topology that carries network traffic at the nominal rate of 1000 Mbit/s half duplex and 2000 Mbit/s full duplex and a wireless connection according to an embodiment of the invention and 1000BASE-T Topology is shown in FIGS. 3A and 3B. FIG. 3A illustrates the typical topology for a 1000BASE-T connection 300 using twisted pair cable from Station A 302 to Station B 320. The flow of network traffic is bi-directionally and may be concurrent because, among other things, each station employs a hybrid transmitter receiver capable of both sending and receiving with echo cancellation. Going from left to right, the hybrid transmitter/receiver 304 in Station A 302 is connected to a CMC 306, and then an isolation transformer 308. The isolation transformer 308 is connected to the media interface connector 310 of Station A 302. A twisted pair cable 312 connects the media interface connector 310 of Station A 302 to the media interface connector 322 of Station B 320. In Station B 320, the media interface connector 322 is connected to the isolation transformer 324, the CMC 326, and finally the receiver 328. The other connections in FIG. 3A are not illustrated with Station A and Station B but are merely duplicated four times, one per twisted pair connection.

FIG. 3B illustrates an Ethernet connection between Station A and Station B that displays a topology based on 1000BASE-T topology that uses close proximity inductively coupled wireless connections 350. As shown in FIG. 3B, in place of the isolation transformer and twisted pair media that are seen in the traditional 1000BASE-T topology, is a separable coupling transformer that is aligned to connect Station A 352 and Station B 370. The media interface connector is no longer required in this connection but the CMC is still present. Also, note that there are four separate connections made. Data moves from the hybrid transmitter/receiver 354 in Station A 352 to the CMC 356 and then the separable coupling transformer 358 of Station A 352. The signal passes to the separable coupling transformer 372 of station B 370, the CMC 374, and finally the hybrid transmitter/receiver 376. The other connections in FIG. 3B are not illustrated with Station A and Station B but are merely duplicated four times.

A connection via a close-proximity inductively coupled transformer via Ethernet presents many advantages over existing radio frequency based wireless connections such as Wi-Fi, ultra wideband, and any other radio frequency wireless connections. First and foremost, using an Ethernet connection allows one to leverage the existing infrastructure that exists for Ethernet. For example, many devices already contain Ethernet based networking chips and thus no further changes must be made to the Ethernet signaling portion of the device other than modifications to the transformer and elimination of physical media connectors. RF technologies such as Wi-Fi are also more expensive and present difficulties that may be encountered from interference of devices that share a similar frequency and additional regulations by the FCC.

In an embodiment, when the two sides of the separable coupling transformer are placed in close proximity to each other in the correct orientation, the magnetic flux generated and transferred between the transformers makes an inductive connection. The separable coupling transformer is only able to create an inductive connection of a correct phase if the two halves of the transformer on each module are oriented correctly with respect to each other. The two transformer halves also need to be within a certain distance from each other in order for the magnetic field to be efficiently coupled between transformer halves. In an embodiment, the correct alignment and orientation is ensured by placing magnets in each module or device so that when any two modules or devices are stacked together or placed in close proximity to each other, the two modules are pulled tightly together minimizing the air gap and forced to be in the correct orientation. The north and south polls of the magnets are arranged such that the modules can only be stacked in the correct orientation, otherwise the magnets repel.

In another embodiment, the correct alignment and orientation of the modules is ensured by placing a marker or design on each of the modules or devices. The marker or design placed on the modules or device may comprise two halves, for example a protrusion on one module and a corresponding indentation on another module or two halves of a logo. When the two modules are placed in correct orientation with each other in order to complete the marker or design, the transformers in the modules are also in the correct orientation to create a wireless Ethernet connection. In another embodiment, an encompassing design is placed across a number of devices or modules. When the devices or modules are placed in the correct orientation, the design may be completed across all of the devices or modules.

As used herein, the term "air gap" is defined as the amount of distance between the two separable coupling transformers located within the modules or devices that are stacked together. In an embodiment, the size of the air gap between the two connecting separable coupling transformers is within a maximum limit that is allowable in order to transmit a signal of a specified quality between the separable coupling transformers. In an embodiment, the size of the air gap may vary from implementation to implementation. The maximum permissible size of the air gap may vary due to a variety of factors, including, but not limited to, the number of windings on the transformer, the size of the conductors used in the windings, the shape of the core used for the separable coupling transformer, the core material used in the separable coupling transformer, or any other factor that may affect the size of the air gap between the two halves of the separable coupling transformer.

In an embodiment, the number of windings on each separable coupling transformer half are symmetric. In another embodiment, the number of windings on each separable coupling transformer half are not symmetric and varies for each separable coupling transformer pair. In an embodiment, the shape of the core of the separable coupling transformer may vary, and can include, but may not be limited to, C-shaped, E-shaped, U-shaped, donut, or rectangular. In an embodiment, the materials used in the separable coupling transformer may comprise any material that allows inductive coupling, including, but not limited to ferrite, powdered iron, cobalt, or nickel iron. In an embodiment, the number of windings on the separable coupling transformers may vary depending upon the shape and material used for the transformer. In an embodiment, the type and material of the separable coupling transformer may vary depending upon the power source of the transmitter being from the center tap of the transformer.

Figure 4:
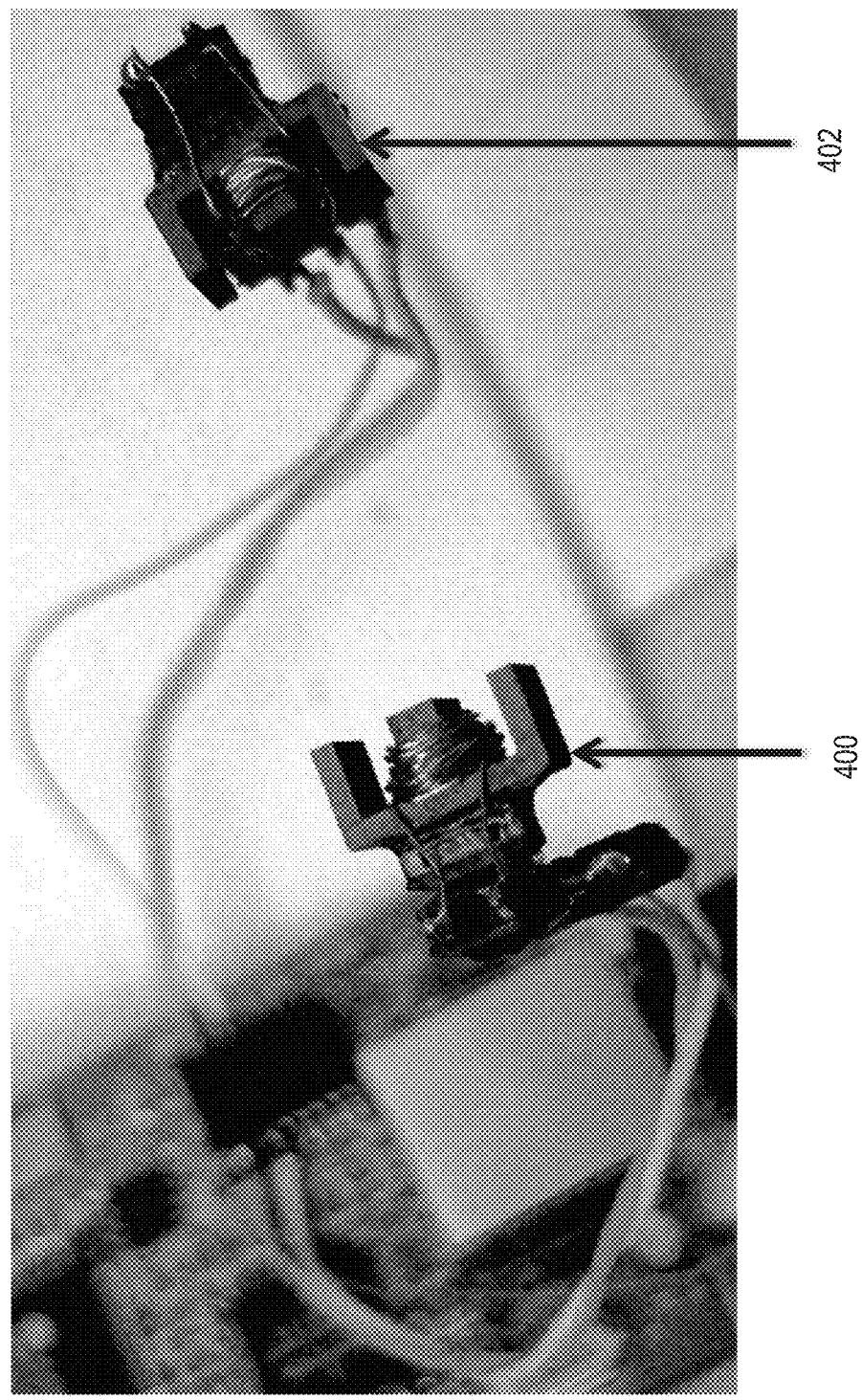
FIG. 4 is a picture that illustrates a separable coupling transformer for use in close proximity inductively coupled wireless Ethernet pictured with the two halves of the transformer separated, according to an embodiment of the invention.
Figure 5:
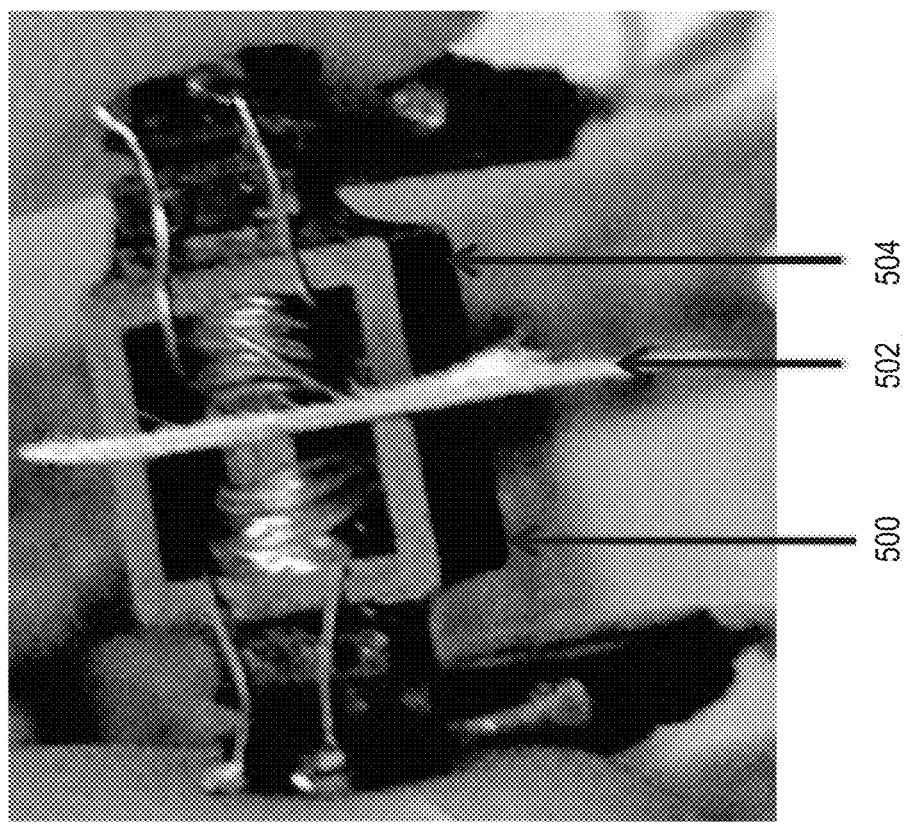
FIG. 5 is a picture that illustrates a separable coupling transformer for use in close proximity inductively coupled wireless Ethernet pictured with the two halves of the transformer connected together, according to an embodiment of the invention.
Figure 6:
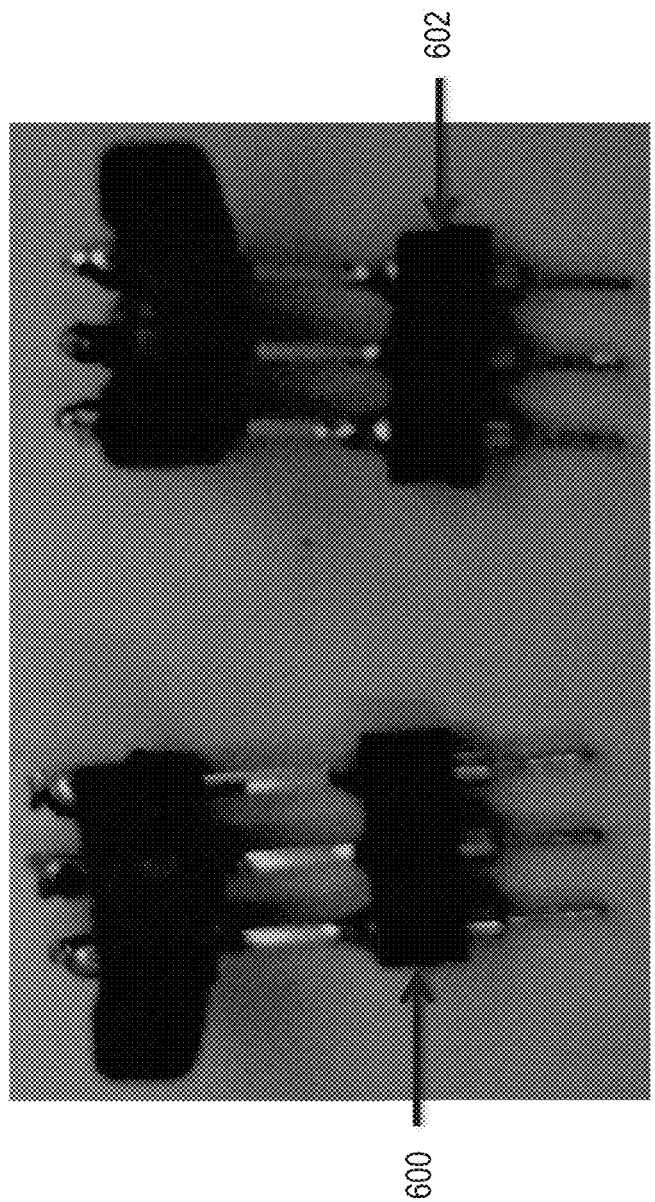
FIG. 6 is a close-up picture that illustrates a separable coupling transformer for use in close proximity inductively coupled wireless Ethernet, according to an embodiment of the invention.
Figure 7:
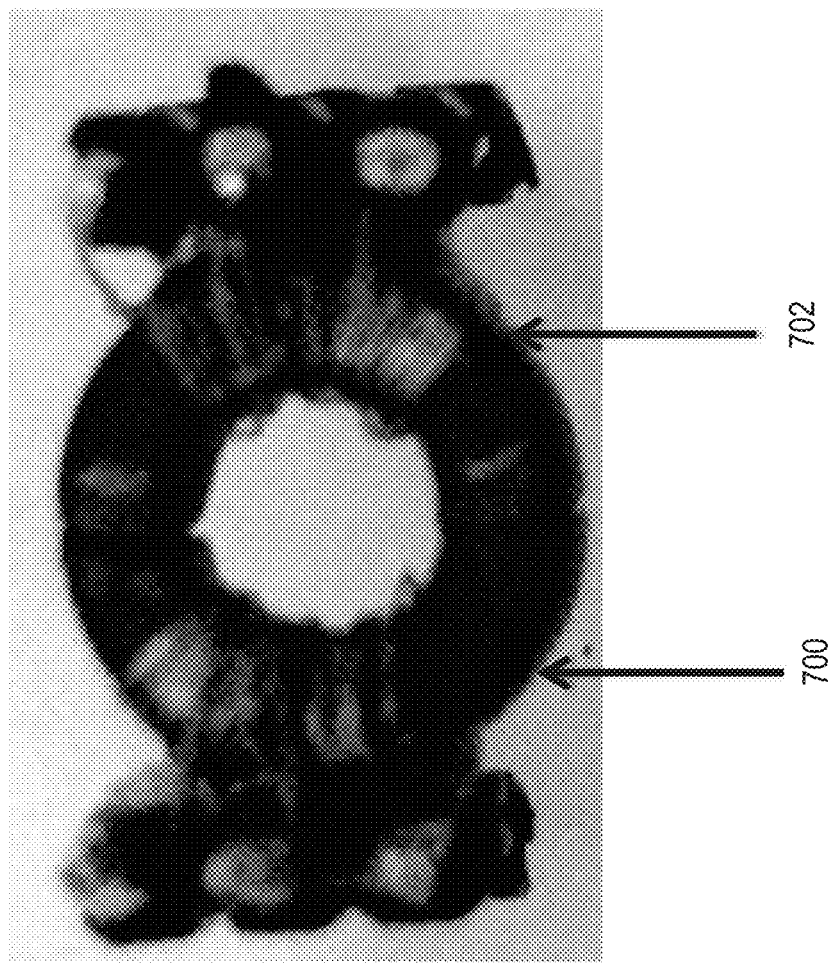
FIG. 7 is a close-up picture that illustrates a separable coupling transformer for use in close proximity inductively coupled wireless Ethernet implemented using C-shape cores, according to an embodiment of the invention.

FIGS. 4-7 show actual pictures of working models of the transformers used in close proximity inductively coupled wireless Ethernet. FIG. 4 illustrates a picture of the two separable coupling transformers that may be used for close proximity inductively coupled wireless Ethernet shown separately and not connected together. Element 400 shows one half of the two separable coupling transformers and element 402 displays the other half. FIG. 5 illustrates a picture of the two separable coupling transformers that may be used for close proximity inductively coupled wireless Ethernet shown held together. The two separable coupling transformers 500 and 504 are shown held together. The paper held between the two transformers displays the air gap 502. FIG. 6 illustrates a picture of the two separable coupling transformers 600 and 602 that may be used for close proximity inductively coupled wireless Ethernet shown close up. FIG. 7 illustrates a picture of the two separable coupling transformers 700 and 702 that may be used for close proximity inductively coupled wireless Ethernet showing a close up of a C-shaped transformer from a top view.

In an embodiment, in order to determine whether another module or device may be present with an adjacent transformer, the separable coupling transformer in the device or module sends a signal pulse, or chirp. The chirp is active whether or not an adjacent transformer is present and results in a magnetic field emitted by the separable coupling transformer. In an embodiment, to limit the radiated emissions caused by the magnetic field, a small amount of paramagnetic material may be placed next to the separable coupling transformer providing a return flux path for the magnetic field emitted by the chip. The small amount of paramagnetic material may be ferrite, such as the material that may be used to make a transformer, or any other material capable of acting as a return to the magnetic field emitted. In an embodiment, the small amount of paramagnetic material is placed at a distance that is larger than the air gap distance between the transformer halves. The increased distance ensures that the small amount of material does not affect the signal sent between the adjacent modules.

In an embodiment, rather than sending a periodic signal to discover the presents of adjacent transformers, the transmitting transformer is activated in a module through another connection made between modules. For example, a power connection between modules might indicate that a module has been placed next to another module, and that the transformer should be activated in order to create the close-proximity inductively coupled wireless Ethernet connection.

In an embodiment, using close-proximity, inductively coupled connections, modules may also be connected to other devices. Rather than only being connected to other similar modules, devices, such as a television may be modified to also be able to connect to other devices or modules using close-proximity, inductively coupled connections. The television might have a compartment or other area specially created to accept modules so that a DVR or cable set top box may be connected unobtrusively and conveniently.

2.1.2 Close Proximity Capacitive Coupled Wireless Connections

In an embodiment, close-proximity wireless connections are also made through capacitive coupled connections. For example, Serial Advanced Technology Attachment ("SATA") connections use capacitive coupling to allow for the DC offset of signals. In capacitive coupling, a pair of plates, with one plate in one module and another plate in another module, are placed in close proximity in order to form a small capacitor that is able to transmit high speed electrical signals from one module to the other module. A detailed description of capacitive coupled connections may be found in "IBM Intelligent Bricks Project—Petabytes and Beyond" by W. W. Wilcke et al. (IBM Journal of Research and Development, Vol. 50, No. 2/3, March/May 2006, pp. 181-197), that is incorporated herein by reference.

2.1.3 Optical Connections

Data may also be transferred between the modules using optical transmission, such as that used with optical audio data. In an embodiment, optical transmitters are placed in modules with an adjacent light pipe. As long as the optical transmissions are correctly aligned (and allow a line of sight to transfer data from one module to another module), an optical connection is made between adjacent modules. In order to connect multiple modules, light pipes are placed going both up and down the stack of modules.

2.1.4 Physical Connections

In an embodiment, physical connections connect adjacent modules in order to allow data transmission between modules. Physical connections refers to any type of connection wherein a physical connection is made between modules. For example, pogo pins may be used. Pogo pins refer to a slender cylinder containing spring-loaded pins. The spring loaded pins connect to another metallic connection point to secure a connection between the two devices. Pogo pins may be seen, for example, in cellular phones where metallic contacts connect the battery to the cellular phone. Any other type of structure capable to performing a connection between devices may also be used to effect a close-proximity physical connection.

Figure 8:
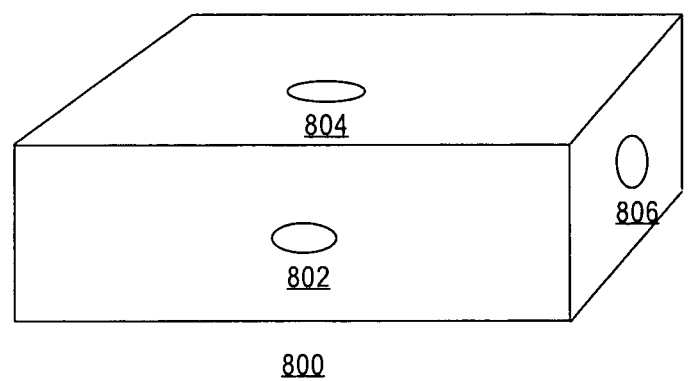
FIG. 8 illustrates connection points on a module and an interior view of the module from a top view, according to an embodiment of the invention.
Figure 8:
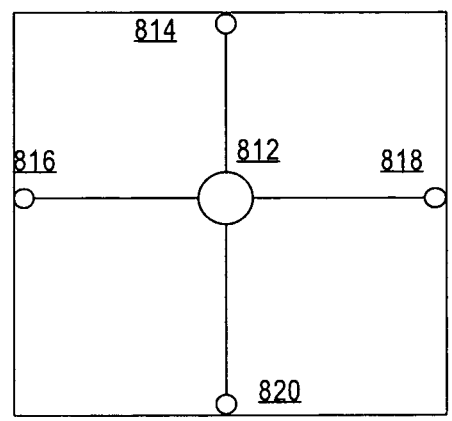

2.1.5 Close Proximity Connections Placement within a Module and Network Topology within the Set of Modules In an embodiment, close proximity connections are placed on each side of a module. Thus, in a traditional rectangular or square module, there would be a total of six separate connectors. The number of connectors may vary depending upon the shape of the module. This is shown in FIG. 8. In FIG. 8, two views of a module are shown with close proximity connections. In module 800, a three-dimensional illustration is shown of the front of a module. On each side of the module that is visible, close proximity connections 802, 804, and 806 are present. The connections are in the interior of the module and thus are not visible from the outside of the module. However, depending upon the implementation, the design of the module may be such that marks are made on the exterior of the module to display to users the placement of each close proximity connection.

In another embodiment, close proximity connections are placed only on particular sides of a module. For example, modules may be designed to only be stacked in a particular design, e.g. vertical stacking, etc, and thus connectors only need to be placed in locations where other neighboring modules would be stacked.

In a set of modules, each node of the network starts and ends with each adjacent module. Thus each module comprises a network switch or router and this is shown in module 810. In module 810, a top-view illustration is shown that shows the interior of a square module. In this particular embodiment, close-proximity connectors are shown as elements 814, 816, 818, and 820 against each side of the module. Connecting each close-proximity connectors is element 812. Element 812 is a switch or router that makes the node of the network and controls the flow of data from the connection in one module to another module. For example, in the case where three modules are stacked vertically on top of each other, the bottom module might wish to communicate with the top module. Under this circumstance, the bottom module uses the switch and transfers data through the middle module to communicate with the top module.

In a set of modules, each module also has a unique IP address within the network. In an embodiment, in order to efficiently allocate IP addresses for the network to each of the modules, a base module of the set of modules has a DHCP server so that IP addresses are assigned to modules dynamically. In an embodiment, IP addresses are assigned based upon the functionality of the particular module. In the circumstance where base modules contain the DHCP server, each set of modules must contain a base module that has a DHCP server. By including the DHCP server within the modules themselves, there is no requirement that the modular communications system needs to be connected to a separate network. In another embodiment, the set of modules are connected to a network that has a DHCP server. Thus, no base module with a DHCP server is necessary. Upon connection of a module to the network, the DHCP server assigns an IP address based upon the functionality of the module. This allows the modules to communicate with an existing home network.

In an embodiment, particular modules with a particular function contain a DHCP server. In the circumstance where more than one module has a DHCP server, then the modules with DHCP servers negotiate with each other in order to determine which module with a DHCP server should assign addresses.

In another embodiment, each module available to users are pre-assigned an IP address so that dynamic assignments are unnecessary. IP addresses may be pre-assigned based on feature. For examples, a group of IP addresses are reserved for modules that perform DVR functions, another group of IP addresses are reserved for modules that perform cable-set top functions, etc. In the case where IP addresses are pre-assigned to modules, the pre-assigned IP address may be later changed by another server or the user in order to remove any IP address conflicts. In another embodiment, an arbitration occurs where IP collisions occur because of a conflict of IP addresses and the IP addresses are updated and resolved to remove the conflict.

2.2 Interconnection and Control of Power Between the Modules

The modules are also interconnected to share power between each module. As one goal of modular design of the communications modules is to remove as much cabling as possible, a single power cable may be used to power all of the modules connected.

In an embodiment, power management in the stack is implemented in a distributed fashion with replicated functions in each module. In an embodiment, each module within the stack contains a small (low power) controller chip, a power switch, and a few discrete components. The base module of the stack also includes components to determine the power rating of an integrated power supply or external power brick (converter to a wall outlet) is connected to the base module.

In an embodiment, the power controller chip within each module has two independent serial links. One serial link communicates with the power controller in the module located above the module and another serial link communicates with the power controller in the module located below. Either or both serial links may be disabled if a module is not present either above or below the module. In an embodiment, the power controller is the master of the link to the module above and a slave to the module below. In other embodiments, the power controller may be a slave to the module above and a master to the module below. This is for horizontal alignments of stacks of modules. Master/slave configurations may also be implemented left to right or right to left for horizontal configurations of modules.

In yet other embodiments, particular modules are given preference to be the master. For example, a module that performs a display function might be given priority over all other modules because the display function is paramount to the function of the entire set of modules. Under this circumstance, other modules might be given lower priorities. Thus, placement is not the determinant of which module is master and which module is slave, but rather the priority assigned to the module is the determinant.

In order to control the amount to power that flows through the set of modules, the power required for each particular module should be known and recorded. In an embodiment, each module transmits data that states the amount of power required for that particular module. This information may be transmitted by the module by any known data transmission methods. The data transmission may be through physical contacts or pins that connect the modules together. In other embodiments, magnets that are also used to align the modules properly may be used to help transmit power, and power information between modules.

In an embodiment, the power controller also detects when a particular module is installed or removed. Depending upon the implementation, the detection may be limited to detecting when the module immediately above the particular module is installed or removed. In other implementations, the power controller is able to detect when any of the plurality of the set of modules has been removed and when a new module has been installed.

In an example, a stack of modules is initially comprised of two modules, a base module "X" and a second module "Y." A third module "Z" is then added to the stack of modules. Upon powering up the base module, the power controller chip of the base module "X" identifies the power brick that connects to the wall outlet in order to determine the total available power for the stack. The power controller chip of the base module "X" then reads a set of strapping pins to determine the power required for the base. The controller subtracts the base power from the brick power to find the remaining available power for all other modules on the stack and stores the result.

The power controller chip in base module "X" then detects whether a module is installed immediately above. In this particular case, the module "Y" is located immediately above module "X". A low voltage source is provided through the physical connection between modules "X," "Y," and "Z" ("XYZ interconnect") to power just the power controller in the "Y" module, and does not power the entire module. The power controller in module "X" then queries the power controller in module "Y" to determine the power requirements of module "Y". The power controller in module "Y" responds to the query by determining the module power requirements, such as by strapping pins, and then transmitting that information back to module "X".

The controller in module "X" subtracts the power required by the "Y" module from the remaining available power to the stack of modules. If the result is greater then zero (and thus, adequate power is available) the controller in module "X" enables the power switch and supplies bulk power to the "Y" module through the XYZ interconnect. The "X" power controller then writes the result into a register in the "Y" power controller, which is the remaining available power for all modules stacked above module "Y." Should not enough power be available for an adjacent module, the newly-installed module is not powered up and an error is returned to the base module. This sequence continues up the stack, with each successive module determining the power needed by the module above and powering the module only if sufficient power is available. This power-on method is inherently sequenced which reduces the likelihood of power-on surges and reduces the cost of some components in the modules.

When module "Z" is added to the stack, the "Y" power controller detects the new module and supplies low voltage power to the "Z" controller. The "Y" power controller then queries the "Z" power controller for the power requirements of module "Z." The required power is subtracted from the remaining available power located with module "Y". The "Y" controller enables the power switch for module "Z" and then the remaining available power is stored in the "Z" power controller.

Different steps are taken upon removal of a module. If the "Z" module is removed, then the "Y" power controller detects the start of the removal of the "Z" module before the power contacts disengage. The "Y" power controller disables the power switch for module "Z" and the energy stored in the "Z" module's bulk power is dumped into a load before the power contacts are broken, reducing the occurrence of any energy arcs across the XYZ interconnect power contacts. Bulk power is thus, never exposed on the XYZ interconnect, and the power supply may not be overloaded with the addition of too many modules (since additional modules that overload the power supply do not power on) making the stack safer.

By limiting communication to only connected modules next to each other, physical connections and the complexity of the stack of modules is reduced. Also, by each module storing the module's power requirements and available power for other modules, other modules (or groups of modules) may be added or removed without affecting the power state of existing modules. This form of powering allows a system to be deployed that does not have knowledge of future module power requirements and adds flexibility as an external brick power supply may be increased to support new modules without affecting existing modules power design.

In module detection, two contacts on the interconnection between modules may be used for communication between power controllers in adjacent modules. One contact supplies low voltage (current limited) power from the lower model to the controller chip in the upper module. A second contact provides a point-to-point serial communications link that also serves as a detection mechanism when a module is added or removed.

The interconnection between modules may be a physical connection in the form of pogo pins. Pogo pins usually take the form of a slender cylinder containing sharp, spring-loaded pins and a mating electrically conductive surface. Pressed between two modules, the spring loaded pins make secure contact with mating conductive surfaces that provide electrical connections between the two modules. For module detection, the two pogo pins that are used for controller chip power and the serial link may be shorter then all other pogo pins. By making these pins shorter, this ensures that the connection for controller power and the serial link make contact last when a module is added, and break contact first when a module is removed. The two pins may be located on opposite sides of the interconnection at a diagonal from each other.

In another embodiment, power is interconnected through the feet of each of the modules. A connection is made at the top of the module where the feet of an adjacent module are placed. The power connection, placed in this way, appears wireless. The connection may be made of any material that is able to conduct power from one module to the next module, such as, but not limited to, stainless steel or gold plated metals. In an embodiment, the connections themselves must have additional protections to avoid a short-circuit or safety hazards. This may include, but is not limited to, physical protections such as a cover protecting the connection area, or the application of power to contacts only when a module has been detected to be adjacent.

In an embodiment, power is interconnected through a close proximity electromagnetic induction. By removing entirely all aspects of interconnection visible from the outside of the module, the connection stays protected and the possibility of a short-circuit is greatly reduced.

2.3 Other Interconnection Configurations

Figure 9:
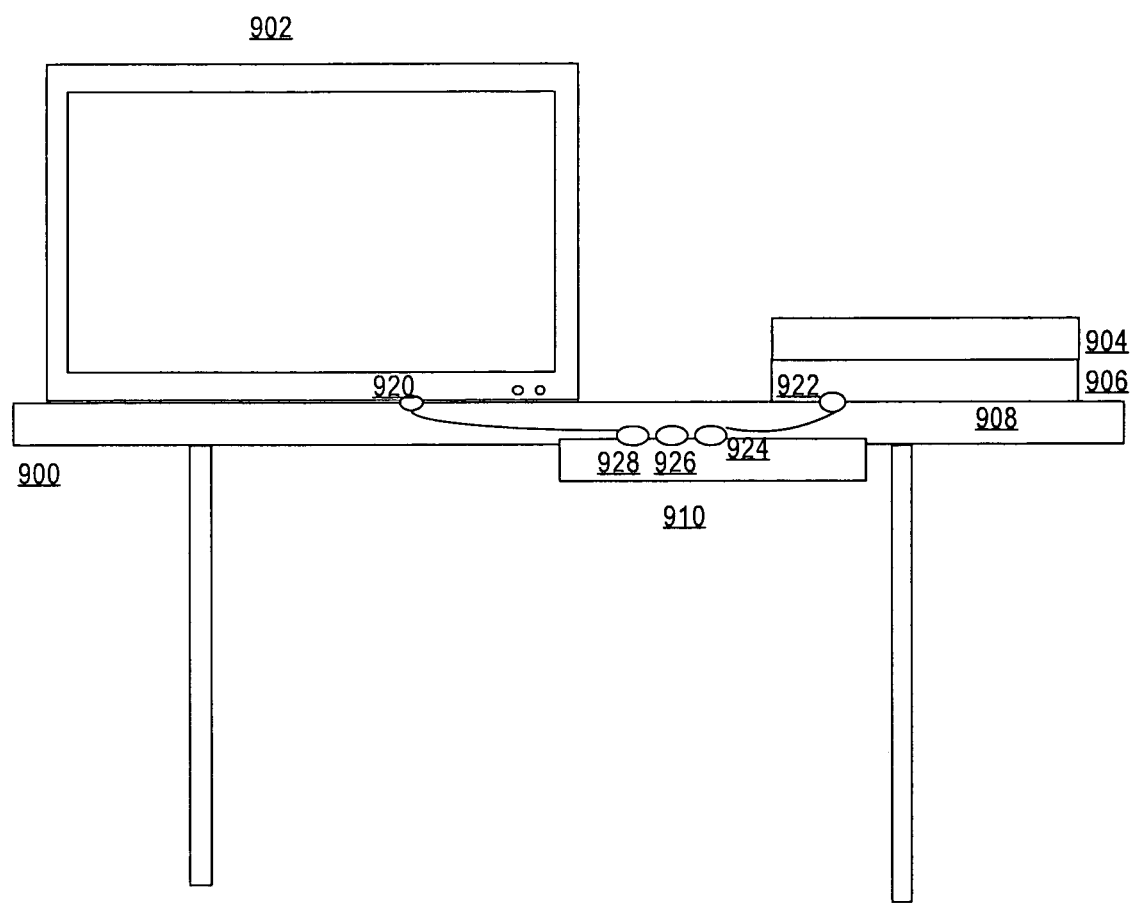
FIG. 9 illustrates a system used in conjunction with a television entertainment system, according to an embodiment of the invention.

In an embodiment, a network switch or router is placed in close distance to where the modules are placed, such as on a table, bookshelf, etc. From the network switch or router, each component of a communications system is interconnected with other components of a communications system. An embodiment of this may be seen in FIG. 9. In FIG. 9, the entertainment system comprises a television set 902, modules 904 and 906, and router 910. The router 910 connects the television set 902 and the modules 904 and 906. In the diagram, a point-to-point connection is shown from the router 910 to each of the components. The router 910 has a plurality of connections including connections 924, 926 and 928. Connection 928 from the router 910 is connected to the television set 902 at connection 920 and the router 910 is also connected via connection 924 to modules 904 and 906 by connection 922. Connection 926 at the router is free and not currently connected to any component in the illustration. The router 910 is built and placed under the table but the placement of the router 910 and any other component of the system may vary depending upon the preference of the user. Modules 904 and 906 may be interconnected via any close-proximity connection to reduce wiring and facilitate ease of setup.

In an embodiment, a common bus system may be used in a stackable communications system. Modules may be interconnected via any type of connection type, but the set of modules are connected to other components, such as a television set, via a common bus. Components may be placed anywhere along the common bus and more choices are available to the user to place modules and components in a position more to his or her choosing. In order to efficiently manage the allocation of available data capacity on a network among devices connected to that network, an allocation system as described in U.S. Pat. Nos. 6,310,886 and 7,158,531 B2, both owned by the Applicants and each of which are hereby incorporated by reference may be employed. In another embodiment, the common bus is built inside of a table. Each part of the entertainment system is connected via the common bus that is built into the table. On the common bus are connection points to connect various components of a system. The common bus interconnects each of the components of the system with modules being interconnected via any connection type.

The common bus is not limited to use with an entertainment center but may also be used with any system that relies on communications such as, but not limited to a computer system, or mobile information devices. For example, to remove wires in a computer system, a common bus built into or on a table might be used to connect a desktop or laptop computer to a separate monitor or printer or any other peripheral device. Security is less of a concern since data is not sent in all directions like typical RF devices, but limited to a close proximity. As such, storage devices such as additional hard drives or memory devices may also be placed safely in the common bus system.

2.4 Reconfigurable Audio System

As the migration from analog to digital entertainment systems has progressed, one increasing problem of the digital living room is the addition of more and more wired connections, especially in audio systems. For example, in a surround sound system, speaker wires might extend from the audio receiver to a center speaker, a subwoofer, side speakers, and rear speakers. This is in addition to the wires already connecting the entertainment system. To implement a whole audio system throughout the home, additional wires must be connecting audio systems to speakers placed in each room. These wires multiply and ruin the decor of a room and increase complexity for installation of the system. These same problems extend to other settings such as commercial theaters or convention centers, educational settings such as in classrooms, or in any other location where a media system is installed.

In an embodiment, the stackable communication system has one or more separate audio servers that perform audio processing for the system. A single audio server may be implemented to perform all of the processing for the home by processing audio for multiple rooms and outdoor audio. Multiple audio servers may be implemented in a home to add more capabilities such as each server servicing a particular room or chaining together the servers for more processing power. Multiple audio servers also are able to communicate with each other and to each module or device connected to the stackable communications system. The audio server may be connected via a wire such as an HDMI cable, or any other data transferring wire. The audio server may also be connected via a wireless connection to the rest of the stackable communication system.

In an embodiment, the audio server is part of a speaker bar. A speaker bar, as discussed herein, refers to a single component that is able to play virtual surround sound without the need to use satellite speakers. The speaker bar comprises a single unit with multiple speakers that is usually placed near the display unit. The speaker bar is able to replicate the different channels found on traditional surround sound systems, such as front, rear, and side channels. The number of channels may vary depending upon the type of speaker bar employed.

In an embodiment, the speaker bar (and audio server) is wired to the base module. In another embodiment, a separate wireless connection is used to connect the speaker bar to the stackable communications system. The audio server (whether or not located within the speaker bar) allows a user to configure a speaker system in many different ways. Each speaker in the speaker system may also be referred to herein as a client of the audio server. The speaker bar is connected to other audio device clients, such as speakers or any other device capable of playing audio, and is capable of configuring each client individually for the user. In an embodiment, the type of speakers that are used with the speaker system are of the same physical configuration. For example, the speakers might have the same physical components such as the same number of tweeter speakers, midrange speakers, low end speakers, and electronic components. Thus, no longer is a user required to purchase multiple types of speaker, one type for side channel surround sound, and another type of speaker for the front channel of the surround sound. Rather, the audio server is able to configure the speaker with the same physical configuration to different functions. This saves the user from having to purchase many different types of speakers (that are also of limited use) and the same speakers may be used in different situations with no loss in audio quality. Other clients that may be connected to the audio server may include, but is not limited to, digital picture frames (with speakers), mp3 players, portable media devices, or any other device that plays and/or processes audio.

In an embodiment, small optional modules are added to the audio server similar to the stackable communications system. For examples, a portable media player might be added that contains additional content or so that content may be transferred to the media player. In another example, additional input/output connectors, wireless HDMI, or additional wireless audio channels might be added to the base functionality of the audio server.

The connection of the audio server to speaker clients may be made in a variety of methods. Some connections may be, but are not limited to wireless, power line connections, wired, Bluetooth, and Wi-Fi. This system of placing the audio server on a speaker bar offloads audio processing to a separate entity (rather than the base module) and may allow more flexibility when installing the audio system. Speaker cables are eliminated along with a separate audio receiver module.

In an embodiment, one set of speakers may be used to play stereo in a room and a single speaker may be used to fill another room with ambient music. The soft configurations of a speaker changes for the particular purpose to which the speaker is used. As used herein, a soft configuration refers to any changes in the speaker configuration that does not change the physical configuration of a speaker. This may refer to, but is not limited to, adjusting the amount of range in a speaker, employing more high range than low range, disabling one of a plurality of speakers in the speaker client, etc. The audio server may adjust the soft configurations of a speaker client. For example, the soft configuration for a speaker playing stereo (for example, the left speaker in a two-speaker setup), would be configured much differently than a single speaker setup that must play all media.

In an embodiment, the same physical configuration of speaker is used throughout a house, with each speaker client configured for a particular purpose. The same physical configuration of speaker as the speaker client allows users to purchase additional speakers easily and without fear that a speaker is limited to a single purpose. For example, the audio server in the speaker bar detects speaker clients throughout the home. Depending upon the speaker's placement in the home, the audio server configures each speaker client for a particular purpose. Speaker clients in the rear of the room are configured to play rear sounds in a surround sound configuration. Speaker clients on the sides of the room are also configured to play left and right sounds in a surround sound configuration. Speaker clients detected in other rooms of the house might be configured to play simple stereo or have a setting to fill a room with ambient music. Yet another speaker client detected that is located in the backyard may be configured to play music outdoors as a full-range speaker. As another example, a speaker client used in one room as a surround speaker may be moved outdoors and reconfigured as a full-range speaker.

In another embodiment, a user may purchase different types of speakers that are specialized for the wireless audio experience. For example, some speaker types that may be employed include, but are not limited to, a speaker bar, surround speakers, subwoofer, mid-range, and tweeters. The audio server is able to detect the type of speaker or audio client and then change the soft configuration of the speaker accordingly. Examples of changes with the soft configuration may result in the audio processing performed by the audio server may change, the audio processing by the audio client may change, and/or the routing of the audio within the client or the server may also change (e.g. reconfiguring how the amplifier drives the speakers). This type of setup is not as flexible but would present the user with the highest sound quality (as the type of speaker is manufactured for only a specific purpose). Under this circumstance, the user is still able to configure the speakers via the audio server. One change that the user may perform is to configure the speakers based upon the type of media being played. For example, jazz music might require a different soft configuration for each speaker than when an action movie is being played.

In an embodiment, speaker clients capable of detection by the audio server may be implemented with an integrated wireless module embedded in the speaker (or a device containing speakers). In another embodiment an external wireless module is connected to one or more traditional wired speakers (or devices containing speakers). The audio server is able to detect the type of speaker (or a profile is entered by the user) and then alter the soft configuration of the speaker and audio system accordingly. Less flexible, special-purpose speakers (subwoofers, high range speakers, etc.) may be intermixed with the speakers clients described as the same physical configuration speaker. For example, a typical installation might be to add one or more specialized wireless subwoofers throughout the house to extend the bass response, with all other speakers being a same physical configuration speaker configured throughout the home for a particular purpose such as left surround, rear surround, or patio ambient. Over time, additional specialized speakers may be installed such as a picture frame, with integrated speakers, for other specific uses.

The detection and configuration of speakers may occur in a variety of methods. In an embodiment, the audio server may continuously monitor for the introduction of new speakers to the area. When a user comes home with an additional speaker client, the audio server would automatically detect the discovery signal from the speaker client and then reconfigure the speaker. In another embodiment, new speaker clients transmit a message to any available audio server to announce that a new speaker is being added to the system. When the audio server detects that a new speaker client is available, then the audio server would configure the speaker for the system.

In an embodiment, when the audio server detects a new speaker client in the system, the audio server prompts the user for additional information on how to configure the speaker client. The audio server may employ a graphical user interface on a display device. The graphical user interface may present the user with a variety of available soft configurations to which the speaker may be configured. When the user selects a particular soft configuration, the audio server then configures the speaker client according to the selection of the user. In another embodiment, the audio server prompts the user via voice or audio prompts. The user may respond orally or through any type of user command input.

In another embodiment, each speaker client contains an indicator that indicates a particular soft configuration for the speaker client. This indicator may be a physical switch or pin that a user may manipulate to specify the preferred soft configuration or location of the speaker client. The indicator may also be a display screen on which a graphical user interface is presented to the user. The user may use any input method (stylus, touch-screen, touchpad, keyboard, etc.) to indicate the preferred soft configuration or location of the speaker client. For example, a user might indicate on the speaker client that the speaker is to be used as a rear channel surround sound speaker. Under this circumstance, the audio server would detect the speaker module and the indicated soft configuration on the switch. The audio server would then reconfigure the speaker client accordingly, and may perform additional reconfigurations depending upon the type and genre of content that is to be played.

In yet another embodiment, the audio server may detect a location of a newly installed speaker client, for example, via sound feedback detection or wireless detection. The location may be a relative location with respect to the audio server. Based upon the detected location, the audio server determines the most probable use of the speaker and automatically configures the speaker client according to that use. The user may also have the ability to override the selected use by the audio server. For example, the audio server may detect a newly installed speaker to the side left of the front speaker bar. Based upon this information, the audio server determines that the speaker client is most likely a side left channel for surround sound and configures the speaker as such. When the speaker is later moved to another room, the audio server detects the change in location and determines that the speaker is likely to be used for a standard stereo setup. A user may find that the soft configuration determined is incorrect and override the audio server and enter the correct soft configuration.

In another embodiment, multiple audio content streams may be provisioned by an audio server where multiple speaker client systems are configured. The multiple speaker client systems may be equal in number or more than the multiple audio content streams. Under this circumstance, this enables the audio server to play the same music to multiple rooms. The audio server may also be able to synchronize content to the multiple rooms while provisioning a different content stream to another location.

Different types of clients may also be used in the audio setup. Because wireless connections and detection is employed, other media clients such as picture frames, video thin-client set top boxes, mp3 players, and configurable remote controls may be connected to the audio setup. These other clients may be used in a variety of ways. For example, the audio server may detect the presence of an mp3 player in the vicinity. Content from the mp3 player may be received by the audio server and then played throughout all of the speakers in the home, in a single room of the home, or speakers located in the backyard. In another example, with the addition of thin video client boxes, the DVR of the stackable communications system may be employed as a video server. Thin video client boxes might receive a transmission of content from a video server and play the content on a display device. These thin video client boxes may be located throughout a home and allow users to view content located on the video server. The audio server would then transmit the appropriate media to any speaker clients located near the thin video client box for the sound of the content.

Figure 10:
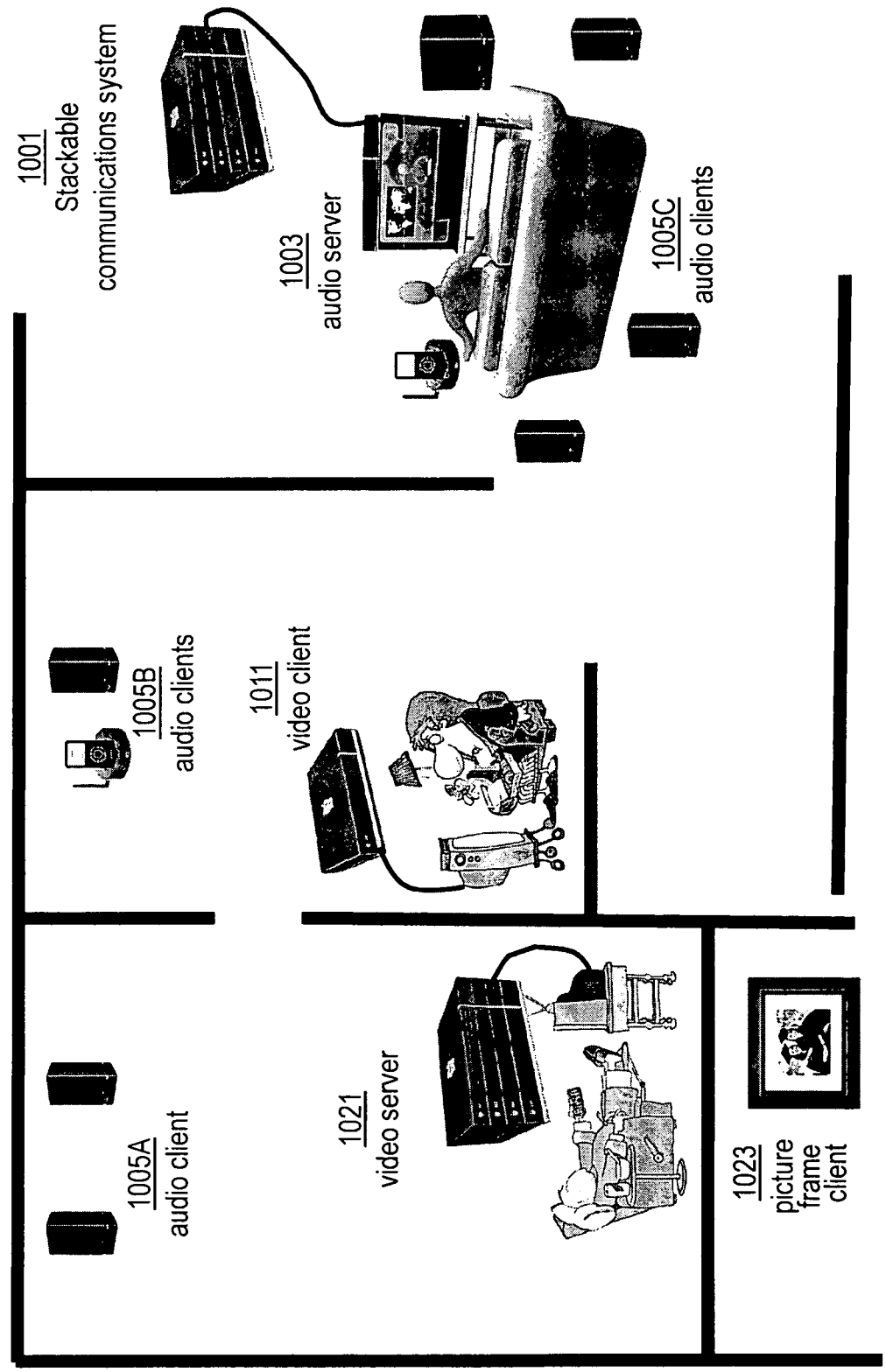
FIG. 10 illustrates a reconfigurable audio system used in conjunction with a stackable communications system, according to an embodiment of the invention.

FIG. 10 displays an example of a configurable audio system connected to a stackable communications system, according to an embodiment. In FIG. 10, stackable communications system 1001 is located in the living room and is connected via an HDMI wire to audio server 1003 that is part of the speaker bar located on the top of a television display device. Audio clients 1005 are located throughout the home and wirelessly connected to audio server 1003. Audio server 1003 adjusts the soft configuration of each audio client 1005 based upon user input or the location of the audio client. Audio clients 1005C is a surround sound system and mp3 player located in the living room, audio clients 1005A is a set of two speaker clients in another room of the home. Audio clients 1005B is a single speaker and portable media device in yet another room. Picture frame client 1023 is another audio client connected to the audio server 1003 and represents an audio device that is capable of playing audio. Finally video server 1021 and video client 1011 are also connected to the audio server 1003 with video server 1021 storing the content that is transmitted to video client 1011.

3.0 Extensions and Alternatives

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

4.0 Implementation Mechanisms

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 11 is a block diagram that illustrates a computer system 1100 upon which an embodiment of the invention may be implemented. Computer system 1100 includes a bus 1102 or other communication mechanism for communicating information, and a hardware processor 1104 coupled with bus 1102 for processing information. Hardware processor 1104 may be, for example, a general purpose microprocessor.

Computer system 1100 also includes a main memory 1106, such as a random access memory (RAM) or other dynamic storage device, coupled to bus 1102 for storing information and instructions to be executed by processor 1104. Main memory 1106 also may be used for storing temporary variables or other intermediate information during execution of instructions to be executed by processor 1104. Such instructions, when stored in storage media accessible to processor 1104, render computer system 1100 into a special-purpose machine that is customized to perform the operations specified in the instructions.

Computer system 1100 further includes a read only memory (ROM) 1108 or other static storage device coupled to bus 1102 for storing static information and instructions for processor 1104. A storage device 1110, such as a magnetic disk or optical disk, is provided and coupled to bus 1102 for storing information and instructions.

Computer system 1100 may be coupled via bus 1102 to a display 1112, such as a cathode ray tube (CRT), for displaying information to a computer user. An input device 1114, including alphanumeric and other keys, is coupled to bus 1102 for communicating information and command selections to processor 1104. Another type of user input device is cursor control 1116, such as a mouse, a trackball, or cursor direction keys for communicating direction information and command selections to processor 1104 and for controlling cursor movement on display 1112. This input device typically has two degrees of freedom in two axes, a first axis (e.g., x) and a second axis (e.g., y), that allows the device to specify positions in a plane.

Computer system 1100 may implement the techniques described herein using customized hard-wired logic, one or more ASICs or FPGAs, firmware and/or program logic which in combination with the computer system causes or programs computer system 1100 to be a special-purpose machine. According to one embodiment, the techniques herein are performed by computer system 1100 in response to processor 1104 executing one or more sequences of one or more instructions contained in main memory 1106. Such instructions may be read into main memory 1106 from another storage medium, such as storage device 1110. Execution of the sequences of instructions contained in main memory 1106 causes processor 1104 to perform the process steps described herein. In alternative embodiments, hard-wired circuitry may be used in place of or in combination with software instructions.

The term "storage media" as used herein refers to any media that store data and/or instructions that cause a machine to operation in a specific fashion. Such storage media may comprise non-volatile media and/or volatile media. Non-volatile media includes, for example, optical or magnetic disks, such as storage device 1110. Volatile media includes dynamic memory, such as main memory 1106. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1102. Transmission media can also take the form of acoustic or light waves, such as those generated during radio-wave and infra-red data communications.

Various forms of media may be involved in carrying one or more sequences of one or more instructions to processor 1104 for execution. For example, the instructions may initially be carried on a magnetic disk or solid state drive of a remote computer. The remote computer can load the instructions into its dynamic memory and send the instructions over a telephone line using a modem. A modem local to computer system 1100 can receive the data on the telephone line and use an infra-red transmitter to convert the data to an infra-red signal. An infra-red detector can receive the data carried in the infra-red signal and appropriate circuitry can place the data on bus 1102. Bus 1102 carries the data to main memory 1106, from which processor 1104 retrieves and executes the instructions. The instructions received by main memory 1106 may optionally be stored on storage device 1110 either before or after execution by processor 1104.

Computer system 1100 also includes a communication interface 1118 coupled to bus 1102. Communication interface 1118 provides a two-way data communication coupling to a network link 1120 that is connected to a local network 1122. For example, communication interface 1118 may be an integrated services digital network (ISDN) card, cable modem, satellite modem, or a modem to provide a data communication connection to a corresponding type of telephone line. As another example, communication interface 1118 may be a local area network (LAN) card to provide a data communication connection to a compatible LAN. Wireless links may also be implemented. In any such implementation, communication interface 1118 sends and receives electrical, electromagnetic or optical signals that carry digital data streams representing various types of information.

Network link 1120 typically provides data communication through one or more networks to other data devices. For example, network link 1120 may provide a connection through local network 1122 to a host computer 1124 or to data equipment operated by an Internet Service Provider (ISP) 1126. ISP 1126 in turn provides data communication services through the world wide packet data communication network now commonly referred to as the "Internet" 1128. Local network 1122 and Internet 1128 both use electrical, electromagnetic or optical signals that carry digital data streams. The signals through the various networks and the signals on network link 1120 and through communication interface 1118, which carry the digital data to and from computer system 1100, are example forms of transmission media.

Computer system 1100 can send messages and receive data, including program code, through the network(s), network link 1120 and communication interface 1118. In the Internet example, a server 1130 might transmit a requested code for an application program through Internet 1128, ISP 1126, local network 1122 and communication interface 1118.

The received code may be executed by processor 1104 as it is received, and/or stored in storage device 1110, or other non-volatile storage for later execution.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An apparatus comprising:
    a first part of a separable coupling transformer; and
    a first chassis configured to be in one or more physical surface contacts through stacking with a second different chassis of a second different apparatus, the second apparatus comprising a second part of the separable coupling transformer;
    the first chassis at least containing the first part of the separable coupling transformer and an Ethernet transmitter electrically connected to the first part of the separable coupling transformer;
    the first part of the separable coupling transformer configured to:
        maintain, through the one or more physical surface contacts, an inductive coupling to the second part of the separable coupling transformer placed within an inductive range of the first part;
        establish a wireless Ethernet communications link with the second part of the separable coupling transformer;
        receive an Ethernet signal from the Ethernet transmitter; and
        send the Ethernet signal un-modulated to the second part of the separable coupling transformer through the wireless Ethernet communications link.

2. The apparatus of claim 1,
    wherein the Ethernet transmitter is configured to:
        send, through the wireless Ethernet communication link, network traffic to the second apparatus.

3. The apparatus of claim 1, further comprising:
    an Ethernet receiver electrically connected to the first part of the separable coupling transformer, the Ethernet receiver configured to receive, through the wireless Ethernet communications link, network traffic from the second apparatus.

4. The apparatus of claim 1, wherein the first part of the separable coupling transformer comprises a core with at least one of a C-shape, E-shape, U-shape, donut-shape, or rectangular shape.

5. The apparatus of claim 4, wherein a number of windings on the second part of the separable coupling transformer is symmetric with a number of windings on the first part of the separable coupling transformer.

6. The apparatus of claim 1, wherein the first apparatus and the second apparatus are vertically stacked.

7. The apparatus of claim 1, wherein the first apparatus and the second apparatus are horizontally stacked.

8. An apparatus comprising:
    a first part of a first separable coupling transformer;
    a first part of a second separable coupling transformer;
    a first chassis configured to be in one or more physical surface contacts through stacking with a second different chassis of a second different apparatus, the second apparatus comprising a second part of the first separable coupling transformer, the second apparatus comprising a second part of the second separable coupling transformer;
    the first chassis at least containing the first part of the first separable coupling transformer and an Ethernet transmitter electrically connected to the first part of the first separable coupling transformer;
    the first part of the first separable coupling transformer configured to:

maintain, through the one or more physical surface contacts, a first inductive coupling to the second part of the first separable coupling transformer placed within an inductive range of the first part of the first separable coupling transformer;

establish a first wireless Ethernet communications link for transmitting network traffic with the first separable coupling transformer;

receive a first Ethernet signal from the Ethernet transmitter; and send the first Ethernet signal un-modulated to the second part of the first separable coupling transformer through the first wireless Ethernet communications link;

the first part of the second separable coupling transformer configured to:

maintain, through the one or more same physical surface contacts, a second inductive coupling to the second part of the second separable coupling transformer placed within an inductive range of the first part of the second separable coupling transformer; and establish a second wireless Ethernet communications link for receiving network traffic with the second separable coupling transformer;

an Ethernet receiver electrically connected to the first part of the second separable coupling transformer, the first part of the second separable coupling transformer configured to receive a second Ethernet signal from the second part of the second separable coupling transformer through the second wireless Ethernet communications link.

9. A method, comprising:

establishing one or more physical surface contacts through stacking between a first chassis of a first apparatus and a second different chassis of a second different apparatus, the first apparatus comprising a first part of a separable coupling transformer, the second apparatus comprising a second part of the separable coupling transformer, the first chassis at least containing the first part of the separable coupling transformer and an Ethernet transmitter electrically connected to the first part of the separable coupling transformer;

maintaining, through the one or more physical surface contacts, an inductive coupling between the first part of the separable coupling transformer and the second part of the separable coupling transformer placed within an inductive range of the first part;

establishing a wireless Ethernet communications link between the first part of the separable coupling transformer and the second part of the separable coupling transformer;

receiving, by the first part of the separable coupling transformer, an Ethernet signal from the Ethernet transmitter; and sending, by the first part of the separable coupling transformer, the Ethernet signal un-modulated to the second part of the separable coupling transformer through the wireless Ethernet communications link.

10. The method of claim 9, further comprising sending, by the Ethernet transmitter through the wireless Ethernet communication link, network traffic to the second apparatus.

11. The method of claim 9, wherein an Ethernet receiver is electrically connected to the first part of the separable coupling transformer and is configured to receive, through the wireless Ethernet communications link, network traffic from the second apparatus.

12. The method of claim 9, wherein the first part of the separable coupling transformer comprises a core with at least one of a C-shape, E-shape, U-shape, donut-shape, or rectangular shape.

13. The method of claim 12, wherein a number of windings on the second part of the separable coupling transformer is symmetric with a number of windings on the first part of the separable coupling transformer.

14. The method of claim 9, wherein the first apparatus and the second apparatus are vertically stacked.

15. The method of claim 9, wherein the first apparatus and the second apparatus are horizontally stacked.

16. A method, comprising:

establishing one or more physical surface contacts through stacking between a first chassis of a first apparatus and a second different chassis of a second different apparatus, the first apparatus comprising a first part of a first separable coupling transformer and a first part of a second separable coupling transformer, the second apparatus comprising a second part of the first separable coupling transformer and a second part of the second separable coupling transformer, the first chassis at least containing the first part of the first separable coupling transformer and an Ethernet transmitter electrically connected to the first part of the first separable coupling transformer;

maintaining, through the one or more physical surface contacts, a first inductive coupling between the first part of the first separable coupling transformer and the second part of the first separable coupling transformer;

establishing a first wireless Ethernet communications link between the first part of the first separable coupling transformer and the second part of the first separable coupling transformer;

receiving, by the first part of the first separable coupling transformer, a first Ethernet signal from the Ethernet transmitter;

sending, by the first part of the first separable coupling transformer, the first Ethernet signal un-modulated to the second part of the second separable coupling transformer through the first wireless Ethernet communications link;

maintaining, through the one or more physical surface contacts, a second inductive coupling between the first part of the second separable coupling transformer and the second part of the second separable coupling transformer;

establishing a second wireless Ethernet communications link between the first part of the second separable coupling transformer and the second part of the second separable coupling transformer;

electrically connecting the first part of the second separable coupling transformer to an Ethernet receiver; and receiving, by the first part of the second separable coupling transformer, a second Ethernet signal from the second part of the second separable coupling transformer through the second wireless Ethernet communications link.

* * * * *